(12) United States Patent
Esmark

(10) Patent No.: US 8,623,731 B2
(45) Date of Patent: Jan. 7, 2014

(54) METHODS OF FORMING ELECTROSTATIC DISCHARGE DEVICES

(71) Applicant: Kai Esmark, Neuried (DE)

(72) Inventor: Kai Esmark, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/732,196

(22) Filed: Dec. 31, 2012

(65) Prior Publication Data

US 2013/0122677 A1    May 16, 2013

Related U.S. Application Data

(62) Division of application No. 12/714,985, filed on Mar. 1, 2010, now Pat. No. 8,350,355.

(51) Int. Cl.
 *H01L 21/331* (2006.01)
(52) U.S. Cl.
 USPC 438/361; 257/520; 257/E29.03; 257/E21.572

(58) Field of Classification Search
None
See application file for complete search history.

(56) References Cited

U.S. PATENT DOCUMENTS

| | | | |
|---|---|---|---|
| 6,266,222 B1 | 7/2001 | Colombo et al. | |
| 6,396,107 B1 | 5/2002 | Brennan et al. | |
| 6,399,990 B1 | 6/2002 | Brennan et al. | |
| 6,406,948 B1 | 6/2002 | Jun et al. | |
| 2002/0173098 A1 | 11/2002 | Tang et al. | |
| 2004/0135141 A1 | 7/2004 | Pequignot et al. | |
| 2009/0244796 A1 | 10/2009 | Tang et al. | |

*Primary Examiner* — Julio J Maldonado
*Assistant Examiner* — Sonya D McCall Shepard
(74) *Attorney, Agent, or Firm* — Slater & Matsil, L.L.P.

(57) ABSTRACT

Electrostatic discharge devices and methods of forming thereof are disclosed. In one embodiment, a semiconductor device includes an electrostatic discharge (ESD) device region disposed within a semiconductor body. A first ESD device is disposed in a first region of the ESD device region, and a second ESD device disposed in a second region of the ESD device region. The second region is separated from the first region by a first trench.

34 Claims, 9 Drawing Sheets

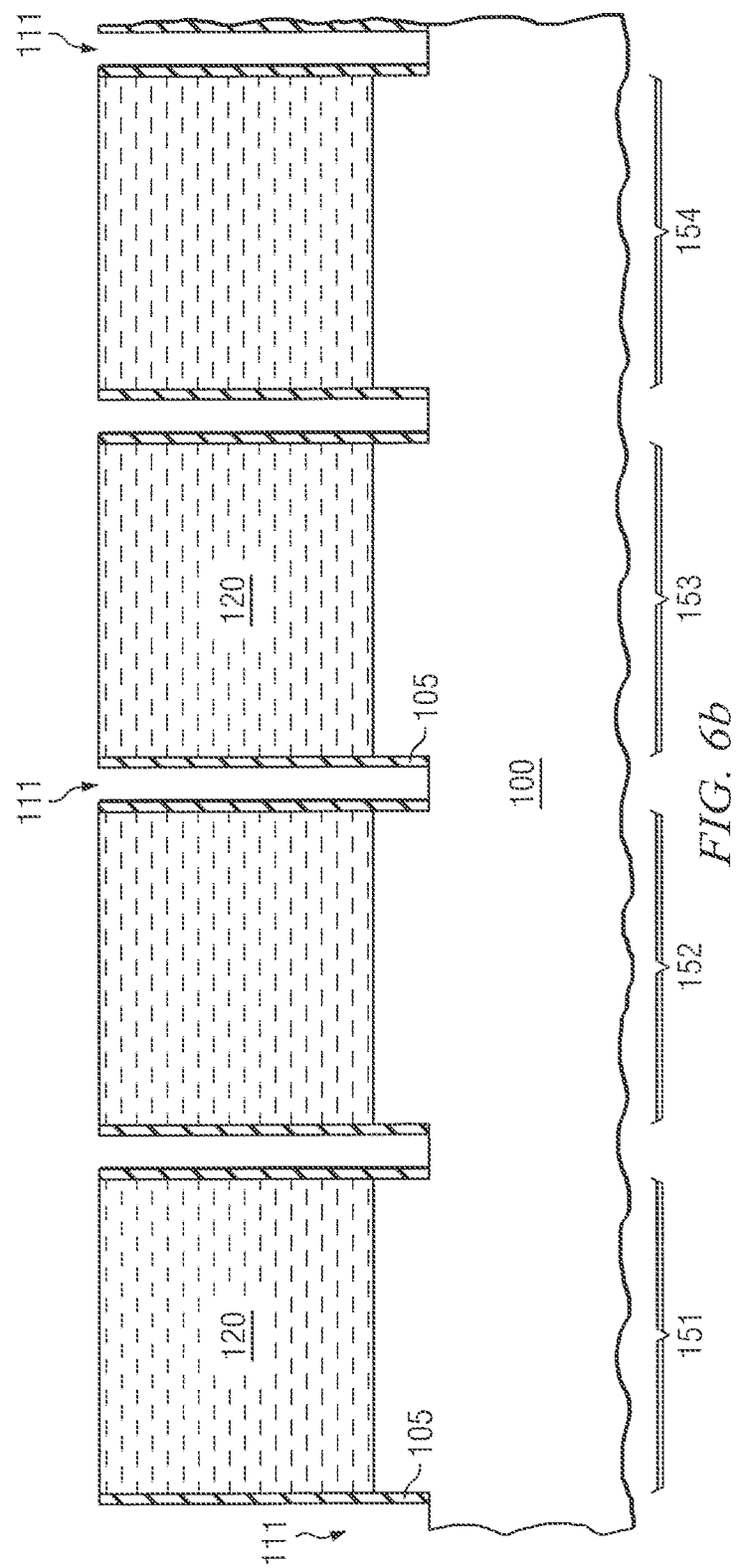

METHODS OF FORMING ELECTROSTATIC DISCHARGE DEVICES

This is a divisional application of U.S. application Ser. No. 12/714,985, which was filed on Mar. 1, 2010, and is incorporated herein by reference.

TECHNICAL FIELD

The present invention relates generally to semiconductor devices, and in particular embodiments to electrostatic discharge devices.

BACKGROUND

As electronic components are getting smaller and smaller along with the internal structures in integrated circuits, it is getting easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry.

When an ESD pulse occurs on a transistor, the extremely high voltage of the ESD pulse can break down the transistor and can potentially cause permanent damage. Consequently, the circuits associated with the input/output pads of an integrated circuit need to be protected from ESD pulses so that they are not damaged.

Device failures that result from ESD events are not always immediately catastrophic or apparent. Often, the device is only slightly weakened but is less able to withstand normal operating stresses and, hence, may result in a reliability problem. Therefore, various ESD protection circuits should be included in the device to protect the various components.

ESD protection devices are designed based on the type of component that is being protected. However, designing ESD protection devices for high voltage components requires overcoming a number of limitations imposed by the need to reduce the device area without reducing the required high voltage protection.

SUMMARY OF THE INVENTION

In one embodiment, a semiconductor device comprises an electrostatic discharge (ESD) device region disposed within a semiconductor body. A first ESD device is disposed in a first region of the ESD device region. A second ESD device is disposed in a second region of the ESD device region, the second region being separated from the first region by a first trench.

In another embodiment, a semiconductor device comprises a first bipolar transistor having an emitter, a collector and a base region disposed in a first region of an ESD device region of a semiconductor substrate. A second bipolar transistor having an emitter, a collector and a base region is disposed in a second region of the ESD device region. The semiconductor device further comprises a first trench disposed between the first and the second regions, the first trench isolating the first bipolar transistor from the second bipolar transistor.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes

FIG. 4, which includes

FIG. 6, which includes FIGS. 6a-6e, illustrates cross-sectional views of an ESD device in various stages of manufacturing in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Integrated circuits and the geometry of the transistors that make up the core of the integrated circuits continue to be reduced in size and the transistors arranged closer together. Core transistors are typically aggressively scaled and operate at low voltages (e.g., less than about 5V). A transistor's physical size limits the voltage that the transistor can withstand without being damaged. Thus, breakdown voltages of core transistors are lowered and currents capable of overheating components are more frequently reached by the voltages and currents induced by an ESD event.

In contrast, power devices that may be directly coupled to input voltage typically comprise high voltage transistors. Unlike the low voltage transistors, the high voltage transistors may operate up to about 20V and can withstand larger voltages before breakdown.

As a consequence, the ESD protection circuit used for protecting components having core transistors is different from the ESD protection circuit used for protecting power components having larger transistors. However, ESD protection circuits used for protecting power components have to operate at high voltages and tend to consume a large area. High voltage ESD protection devices are difficult to tune with respect to ESD targets. For example, changing the breakdown voltage is difficult and requires complicated changes in the process.

In various embodiments, the present invention overcomes these limitations of designing high voltage devices by using a stack of low voltage devices.

Figure 1:
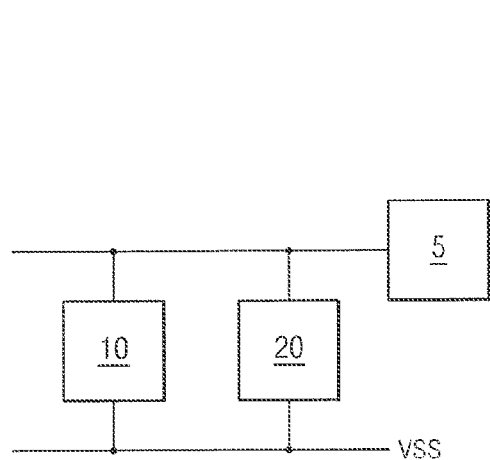
FIG. 1 is a schematic illustration of an ESD device used to protect a circuitry in accordance with embodiments of the invention.

FIG. 1 is a schematic illustration of an ESD device used to protect a circuit in accordance with embodiments of the invention.

As illustrated in FIG. 1, the ESD device 10 is coupled in parallel to the circuitry 20 to be protected. The circuitry 20 to be protected could be any type of circuit. Examples include logic, analog, mixed signal, memory, power circuits including internal buffers, drivers, etc.

Referring to FIG. 1, an ESD device 10 is triggered when an ESD pulse occurs on the pad 5. In the absence of an ESD pulse, the ESD device 10 is in the "off" position and does not conduct any current. When the pad 5 is zapped with an ESD pulse, the ESD device 10 is triggered "on" by the ESD stress voltage to conduct an ESD current from the pad to ground (substrate voltage VSS). Thus the charge from the ESD event is dissipated through a parallel ESD circuit protecting the circuitry 20.

For effective ESD protection, the ESD device must be triggered at a voltage less than the breakdown voltage of the circuitry 20 being protected. For example, in case of a MOS transistor this breakdown voltage is typically the gate oxide breakdown voltage. Hence, the ESD device must turn on at a voltage less than the breakdown voltage to avoid destroying the circuitry 20. In addition, the holding voltage and "on" resistance of ESD device 10 will impact the robustness of the protection. A lower holding voltage and smaller resistance provide a more robust protection. However, the holding voltage must be higher than the operating voltage (VDD) of the circuitry 20 to avoid hindering its operation under normal operating conditions.

As a consequence, the ESD circuitry must be matched with the requirements of the circuit to be protected. For example, an ESD device that is to protect a high voltage device requires higher triggering and holding voltages than an ESD device that is to protect a low voltage device.

However, high voltage ESD protection devices that are required to protect high voltage circuitry typically have many disadvantages. Due to the large triggering voltages, they are large devices requiring a large amount of real estate on the chip. Further, the device behavior of these large devices cannot be easily tuned to meet different individual requirements of different power components.

In contrast, low voltage ESD devices have a number of advantageous characteristics. For example, the trigger speed of the low voltage ESD devices is much higher than that of the high voltage ESD devices. A faster trigger speed is advantageous as it avoids harm to the circuitry 20 during the rise of the ESD pulse before the ESD device 10 is turned on. Low voltage ESD devices also allow better control of ESD robustness with respect to ESD targets. Low voltage ESD devices have much better performance with temperature because the breakdown voltage drift with temperature is smaller than high voltage devices.

However, as described low voltage devices do not have device characteristics suitable for protecting high voltage components. In various embodiments of the present invention, low voltage devices are adapted to high voltage components to produce a circuit having the requisite device characteristics to protect high voltage components.

An embodiment of the invention illustrating a stack of bipolar transistors forming a high voltage ESD protection device will be described using FIG. 2. Further embodiments illustrating a stack of thyristors and diodes will be described using FIGS. 4 and 5. An embodiment of a method of manufacturing the ESD protection device will be described using FIG. 6.

Figure 2A:
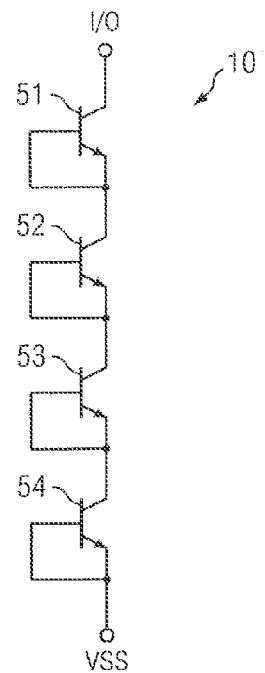
FIGS. 2a and 2b, illustrates an embodiment of the invention of a stack of low voltage ESD devices forming a high voltage ESD protection device.
Figure 2B:
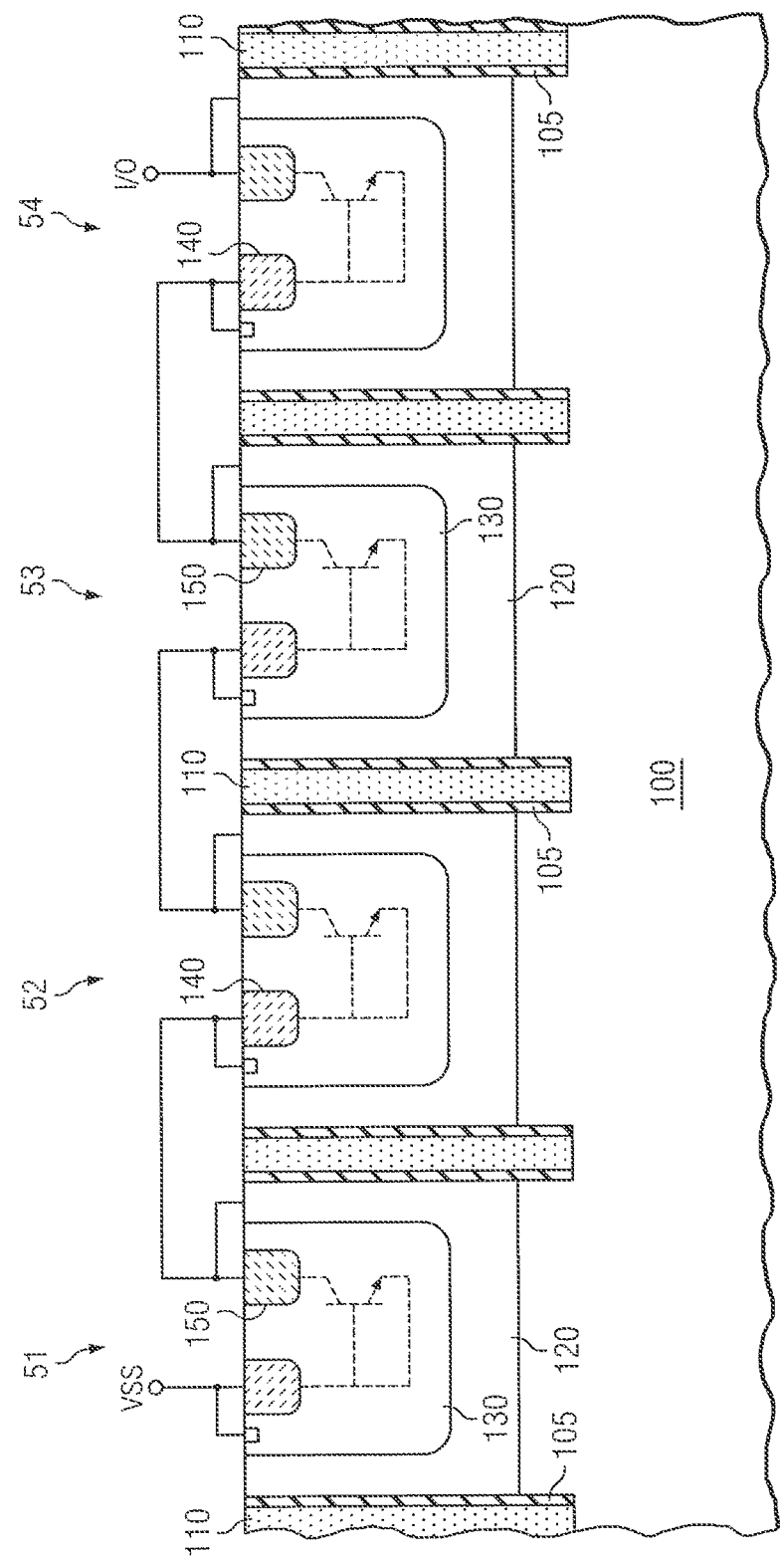

FIG. 2, which includes FIGS. 2a and 2b, illustrates an embodiment of the invention of a stack of low voltage ESD devices (bipolar transistors) forming a high voltage ESD protection device.

FIG. 2a illustrates a circuit diagram of an ESD device in accordance with an embodiment of the invention. Referring to FIG. 2a, a first, a second, a third, and a fourth bipolar transistor 51-54 are stacked to form the ESD device 10. Each of the bipolar transistor 51-54 may be used individually for ESD protection of a low voltage circuitry. As will be described below, although the bipolar transistors 51-54 are drawn tightly on silicon, parasitic devices do not exist between the bipolar transistors 51-54. Hence, advantageously the area occupied by the stack of bipolar transistors 51-54 is much smaller than the equivalent single high voltage transistor.

FIG. 2b illustrates a cross-sectional view of the ESD device in accordance with an embodiment of the invention.

Referring to FIG. 2b, trenches 110 are embedded in the substrate 100, and electrically isolate the doped regions. The trenches 110 are lined with an insulating liner 105. The insulating liner 105 may comprise an oxide or a nitride, or a combination. The insulating liner 105 may comprise a single layer or plurality of layers in various embodiments. The trenches 110 are filled with polysilicon and doped to a high conductive state. In various embodiments, the trenches 110 are doped higher than about $1 \times 10^{19}$ cm$^{-3}$.

In some embodiments, all the trenches 110 may be filled with an insulator such as an oxide. In such embodiments, the trenches 110 only help to isolate and do not have the added function of being a contact to the substrate 100. Similarly, in some embodiments, the trenches 110 may be filled with undoped or low doped polysilicon without lining the sidewalls with an insulating liner 105 as described above. The low doped p-n junction thus forms the isolation structure as long as the breakdown voltage of the p-n junction is higher than the maximum operating voltage of the ESD device. The lower breakdown is achieved by lowering the doping of the polysilicon at the p-n junction. Alternatively, in some embodiments, low doped semiconductors having a wider band gap than silicon may be used instead of polysilicon. Examples of materials that may be used to fill the trench include SiC, GaN, GaP, InP, ZnO, ZnS.

A first well region 120 is disposed in the substrate 100 and comprises a low doped n-type region. In various embodiments, the first well region 120 is doped to a concentration of about $5 \times 10^{16}$ cm$^{-3}$ to about $5 \times 10^{18}$ cm$^{-3}$, and about $5 \times 10^{17}$ cm$^{-3}$ in one embodiment. In one or more embodiments, the depth of the trenches 110 is selected to ensure that the trenches 110 are deeper than the lower surface of the first well region 120.

A second well region 130 is disposed within the first well region 120. The second well region 130 comprises a low doped p-type region. In various embodiments, the second well region 130 is doped to a concentration of about $5 \times 10^{16}$ cm$^{-3}$ to about $5 \times 10^{18}$ cm$^{-3}$, and about $5 \times 10^{17}$ cm$^{-3}$ in one embodiment.

A first doped region 140 and a second doped region 150 form the emitter region and collector region of the bipolar transistors 51-54. The first and the second doped regions 140 and 150 are thus doped to be a heavily doped n+ region. The first and the second doped regions 140 and 150 may be doped with arsenic wherein the doping is greater than about $1 \times 10^{19}$ cm$^{-3}$, and higher than about $1 \times 10^{20}$ cm$^{-3}$ in one embodiment. In various embodiments, the first and the second doped regions 140 and 150 comprise a doping such that the Fermi level is within about 0.1 eV from the valence band of the substrate 100.

As illustrated, for each transistor, the emitter and base of the bipolar transistors are tied together. The collector region of the first bipolar transistor 51 is coupled to the emitter region of the adjacent second bipolar transistor 52.

In one or more embodiments, the trenches 110 may be deep trenches. Alternatively, in one or more embodiments, the trenches 110 may be shallow trenches. In various embodiments, the trenches 110 extend past the first and the second well regions 120 and 130 and into the substrate 100. In various embodiments, the trenches 110 are at least 5 µm deep and about 10 µm to about 20 µm deep. In various embodiments, a depth of the trenches 110 into the substrate 100 is at least 10 times the width of the trenches 110 along the top surface of the substrate 100. In various embodiments, a depth of the trenches 110 into the substrate 100 is between about 10 times to about 30 times the width of the trenches 110 along the top surface of the substrate 100. The trenches 110 are doped to a same conductivity type as the substrate 100 thus forming contacts to the substrate 100.

The use of trenches 110 advantageously increases the packaging density of the low voltage transistors 51-54 by packing these transistors closer without adding any parasitic devices. The improved isolation achieves high breakdown voltages that would otherwise not be possible due to the earlier breakdown of parasitic devices. For example, in the absence of the trenches 110, a parasitic device is formed between adjacent second well regions 130 separated by the first well region 120. In various embodiments, with the inclusion of the trenches 110, any parasitic device still present is not activated before the ESD device is activated. Hence, the ESD device behaves as though no parasitic devices are present. Hence, in one or more embodiments, the depth of the trenches 110 is selected to ensure that the parasitic device is not activated before the ESD device. Alternately, in various embodiments, the depth of the trenches 110 is selected such that the threshold voltage for the parasitic device is greater than the threshold voltage for the ESD device.

If the first well region 120 comprises an n-type doping, the second well region 130 comprises a p-type doping thereby forming a parasitic pnp transistor. This parasitic transistor may have a lower breakdown/trigger voltage than required for the ESD device. Hence, as the ESD pulse voltage exceeds the breakdown/trigger voltage of the parasitic pnp transistor, the ESD device is triggered earlier. For example, if the parasitic breakdown voltage is lower than the operating voltage of the device, the ESD device is always triggered, severely impacting the operation of the circuitry. Consequently, such an ESD device formed by stacking low voltage devices without trenches 110 cannot be used to protect higher voltage components. Thus, the trenches 110 enable effective ESD protection using a stack of low voltage devices in a bulk substrate.

In various embodiments, the use of the trenches 110 eliminates this parasitic transistor (and other parasitic devices) thereby allowing the operation of the ESD device. In contrast, because the trenches 110 extend up to the substrate 100, any parasitic device must be established between the first well region 120 and the substrate 100. Because of the low doping of the substrate 100, the breakdown voltage of this device is much higher. For example, the breakdown voltage of diode between the first well region 120 and the substrate 100 can be as high as 100V, and about 80V in one case.

Figure 3:
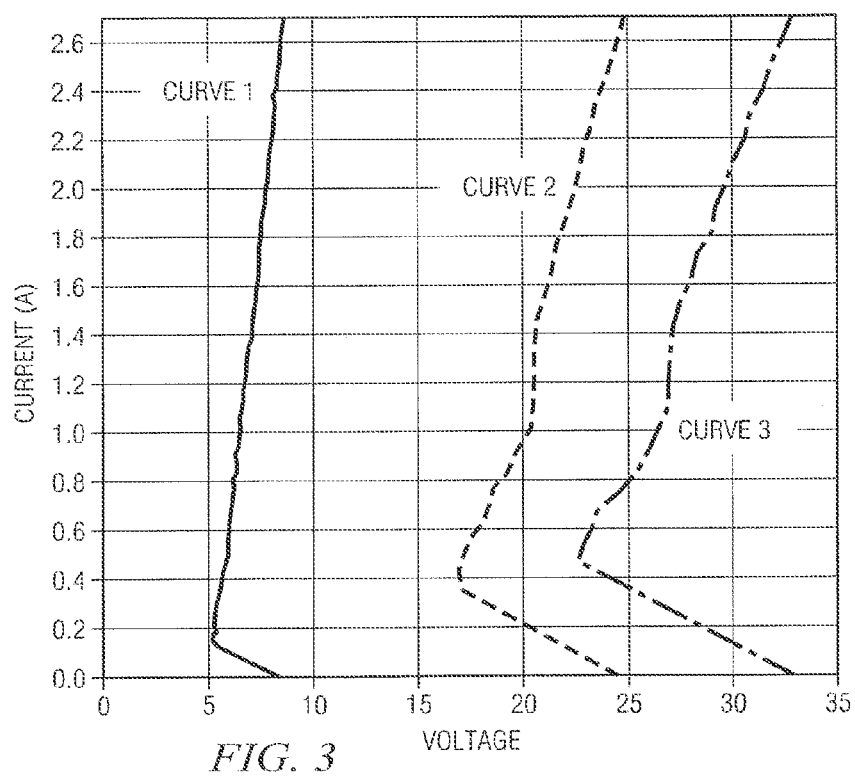
FIG. 3 illustrates the operation of the ESD device formed from a stack of low voltage ESD devices in accordance with embodiments of the invention.

FIG. 3 illustrates the operation of the ESD device formed from a stack of low voltage ESD devices in accordance with embodiments of the invention. Because each device is triggered at its breakdown voltage, the effective breakdown voltage of the stack of the transistors 51-54 is the summation of the breakdown voltage of each transistor. Similarly, the effective hold voltage is also a summation as each transistor drops the hold voltage during its conduction state.

As illustrated in FIG. 3, the effective hold voltage and the effective trigger voltage of a plurality of three transistors (curve 2) is three times the hold voltage and the trigger voltage of a single low voltage transistor (curve 1). Similarly, the effective hold voltage and trigger voltage of a plurality of four transistors (curve 3) is four times the hold voltage and the trigger voltage of a single low voltage transistor (curve 1). Any number of low voltage devices can be stacked accordingly to form high voltage devices. Hence, for example, if the ESD snap down voltage requirement is 15V, a stack of three bipolar transistors can be used. Alternatively, if the ESD snap down voltage requirement is 20V, a stack of four bipolar transistors can be used.

While FIG. 2 illustrated the use of a bipolar transistor as the low voltage transistor, any other device may be used. For example, in other embodiments, the ESD device may be formed by stacking diodes, thyristors, field effect transistors including field oxide (FOX) transistors, double diffused metal oxide semiconductor (DMOS) transistors, insulated-gate field effect transistors (IGFET), and the like. However, low voltage MOS devices are not preferred as the gate dielectric will likely breakdown at a low voltage. In alternative embodiments, the ESD device may be other types of devices including amorphous materials such as chalcogenide materials. An example of such an ESD device is a ovonic threshold device.

Figure 4A:
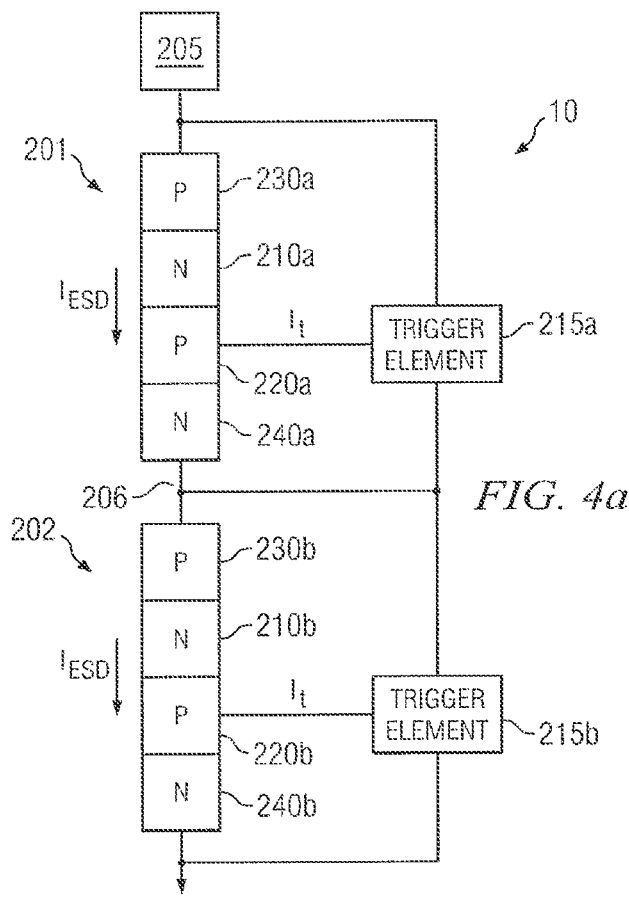
FIGS. 4a and 4b, illustrates a stack of low voltage thyristors forming an ESD device in accordance with an embodiment of the invention.
Figure 5:
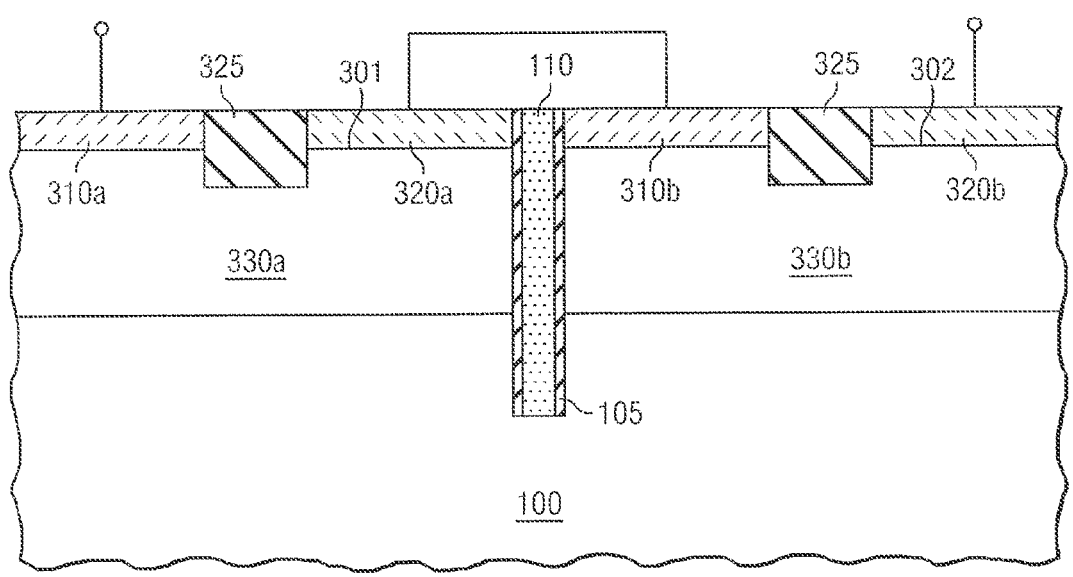
FIG. 5 illustrates an embodiment of the invention wherein a stack of diodes form an ESD device.

FIGS. 4 and 5 illustrate embodiments of the ESD device using thyristors and diodes.

Figure 4B:
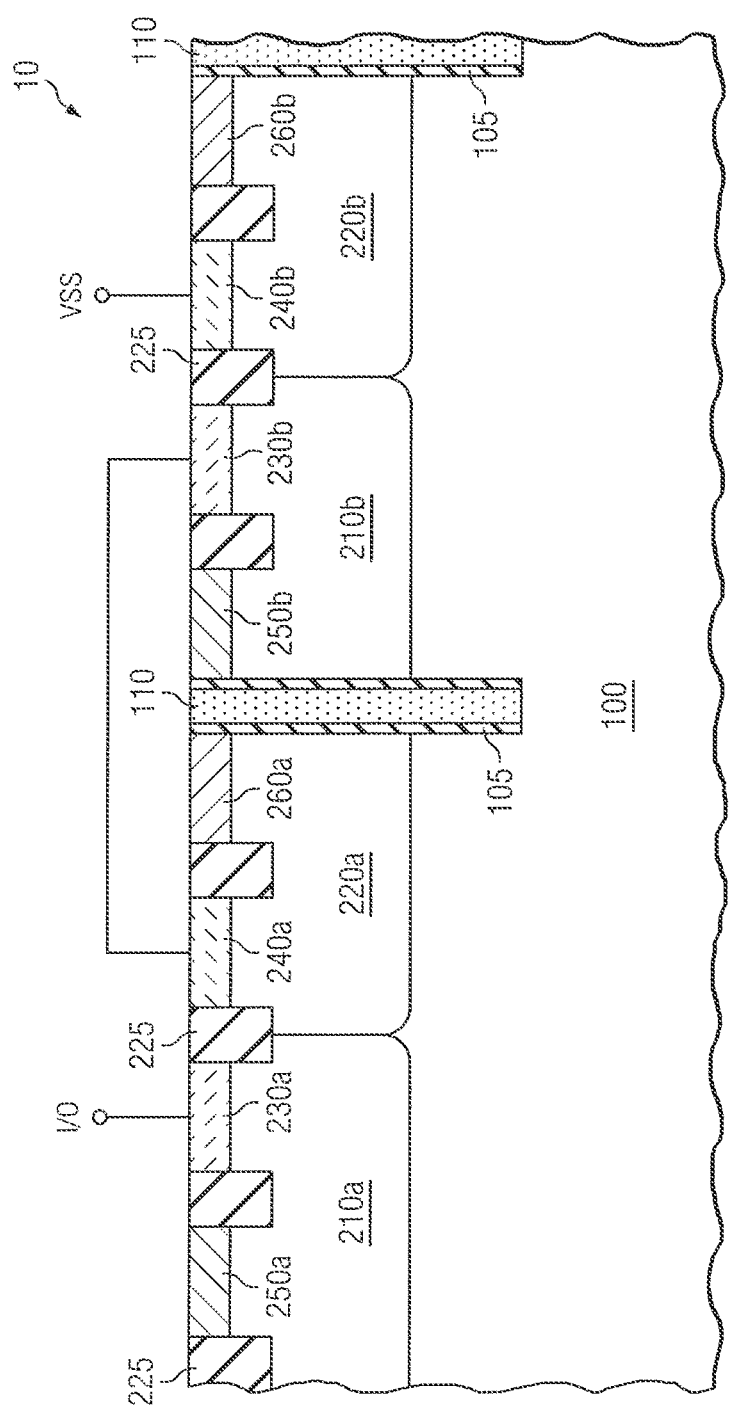

FIG. 4, which includes FIGS. 4a and 4b, illustrates a stack of low voltage thyristors forming an ESD device in accordance with an embodiment of the invention.

Referring to FIG. 4a, a first and a second silicon controlled rectifier (SCR) 201 and 202 are stacked to form an ESD device. Each SCR 201 and 202 includes a p-type anode 230a/230b, an n-type cathode 240a/240b, an n-type n-base SCR region 210a/210b, and a p-type p-base SCR region 220a/220b. The anode 230a and a trigger element 215a are coupled to a node to be protected 205 and an intermediate node 206.

The trigger element 215a causes a trigger current $I_t$ to flow whenever the voltage at node to be protected 205 exceeds a certain threshold. Typical required trigger thresholds are between about 2V and about 20V. The presence of a trigger current $I_t$ causes the SCR to conduct a large current, $I_{ESD}$. When the voltage at node 205 is less than the threshold of the trigger device, the first SCR 201 does not conduct a large current $I_{ESD}$.

In the non-conducting state, the SCR behaves as a bipolar latch, which includes a BJT PNP device, and a BJT NPN device. The representative PNP device is made up of the p-type anode 230a as the emitter, the n-base region 210a as the base, and p-base region 220a as the collector. The representative NPN device is made up of n-base region 210a as the collector, the p-base region 220a as the base, and the n-type cathode 240a as the emitter. When trigger current $I_t$ flows into the base of representative NPN in response to a voltage transient at node 205, the collector of the representative NPN is pulled low, which turns on the representative PNP, which pulls the base of NPN up toward the potential at node 205, thereby latching the bipolar latch and causing a large current $I_{ESD}$ to flow. An optional resistance can be added to the circuit to adjust the trigger level by bleeding away base current from the representative PNP, thereby requiring a higher trigger current to activate the bipolar latch.

After the first SCR 201 is triggered the second SCR 202 is triggered depending on the voltage at the intermediate node 206. As a consequence, the ESD device 10 is triggered only if both the first and the second SCRs 201 and 202 are triggered.

Once the SCRs 201 and 202 are latched, it behaves as a forward biased PIN diode where the intrinsic region includes the n-base region 210a/210b and the p-base region 220a/220b in avalanche breakdown. When the SCRs are turned on, $I_{ESD}$ will continue to flow even if $I_t$ is no longer applied. An SCR fabricated in a submicron process will typically conduct about 10 mA to about 100 mA per μm width. The SCR will stop conduction once $I_{ESD}$ falls below a holding current, typically about 1 μA to about 1 mA of per μm width.

In various embodiments, the trigger element can be coupled differently than is illustrated in FIG. 4a. Further, the trigger element may include any suitable device including active and passive devices.

FIG. 4b illustrates an ESD device comprising a stack of two SCR devices. Only two SCRs are shown for simplicity, whereas in practice more number of SCRs may be similarly stacked to satisfy the ESD target requirements. Although a PNPN SCR is described below, embodiments of the invention also include NPNP SCRs.

A first well region comprising n-type n-base SCR regions 210a and 210b is disposed in the substrate 100. In various embodiments, the n-base SCR regions 210a and 210b are doped to a concentration of about $5 \times 10^{16}$ cm$^{-3}$ to about $5 \times 10^{18}$ cm$^{-3}$, and about $5 \times 10^{17}$ cm$^{-3}$ in one embodiment.

A second well region comprising p-type p-base SCR regions 220a and 220b is disposed adjacent the n-base SCR regions 210a and 210b. In various embodiments, the second well region is doped to a concentration of about $5 \times 10^{16}$ cm$^{-3}$ to about $5 \times 10^{18}$ cm$^{-3}$, and about $5 \times 10^{17}$ cm$^{-3}$ in one embodiment.

P-type anodes 230a and 230b are disposed within the n-base SCR regions 210a and 210b. N-type cathode 240a and 240b are disposed within the p-base SCR regions 220a and 220b. The p-type anodes 230a and 230b and the n-type cathodes 240a and 240b are heavily doped regions. The p-type anodes 230a and 230b may be doped with boron wherein the doping is greater than about $1 \times 10^{19}$ cm$^{-3}$, and higher than about $1 \times 10^{20}$ cm$^{-3}$ in one embodiment. The n-type cathodes 240a and 240b may be doped with arsenic wherein the doping is greater than about $1 \times 10^{19}$ cm$^{-3}$, and higher than about $1 \times 10^{20}$ cm$^{-3}$ in one embodiment.

The p-type anodes 230a and 230b are isolated from the n-type cathodes 240a and 240b by isolation regions 225.

The p-type anode 230a of the first SCR 201 is coupled to the pad to be protected. The n-type cathode 240a of the first SCR 201 is coupled to the p-type anode 230b of the second SCR 202, whereas the n-type cathode 240b of the second SCR 202 is coupled to the substrate voltage (VSS). Contacts 250a/250b help contact the n-type n-base SCR regions 210a and 210b, whereas contacts 260a/260b help contact the p-base SCR regions 220a and 220b.

As in prior embodiments, trenches 110 are embedded in the substrate 100, and electrically isolate the doped regions of the first and the second SCRs 201 and 202. The trenches 110 are lined with an insulating liner 105 and filled with undoped or low doped polysilicon, the doping being the same as the substrate 100. In some embodiments, the trench may be filled with an undoped or low doped large band gap semiconductor such as SiC, GaP, GaN, InP, ZnO, ZnS. Alternatively, the trenches 110 may be filled only with an insulator.

In various embodiments, the trenches 110 extend past the n-base SCR regions 210a/210b and the p-base SCR regions 220a/220b and into the substrate 100. The trenches 110 are doped to a same conductivity type as the substrate 100 thus forming contacts to the substrate 100.

As in prior embodiments, the use of trenches 110 advantageously isolates the first SCR 201 from the second SCR 202. For example, in the absence of the trenches 110, a parasitic device is formed between the p-base SCR region 220a and the n-base SCR region 210b. Due to the heavier doping of the p-base SCR region 220a and/or the n-base SCR region 210b, this diode has a low breakdown voltage and prohibits the use of this device (stack of these SCRs) as a high voltage ESD device.

FIG. 5 illustrates an embodiment of the invention wherein a stack of diodes form an ESD device.

Referring to FIG. 5, well regions 330a and 330b are formed having a low doped region of a first conductivity type. In one embodiment, the first conductivity type is an n-type region. The well regions 330a and 330b are doped to a concentration of about $5 \times 10^{16}$ cm$^{-3}$ to about $5 \times 10^{18}$ cm$^{-3}$, and about $5 \times 10^{17}$ cm$^{-3}$ in one embodiment.

First doped regions 320a/320b are disposed within the well regions 330a/330b. The first doped regions are separated from oppositely doped second doped regions 310a and 310b. The junction between the first doped region 320a and the well region 330a forms a first diode 301, while the junction between the first doped region 320b and the well region 330b forms a second diode 302.

As in prior embodiments, a trench 110 separates the first diode 301 from the second diode 302 avoiding the formation of parasitic diodes.

FIG. 6, which includes FIGS. 6a-6e, illustrates cross-sectional views of an ESD device in various stages of manufacturing in accordance with an embodiment of the invention.

Figure 6A:
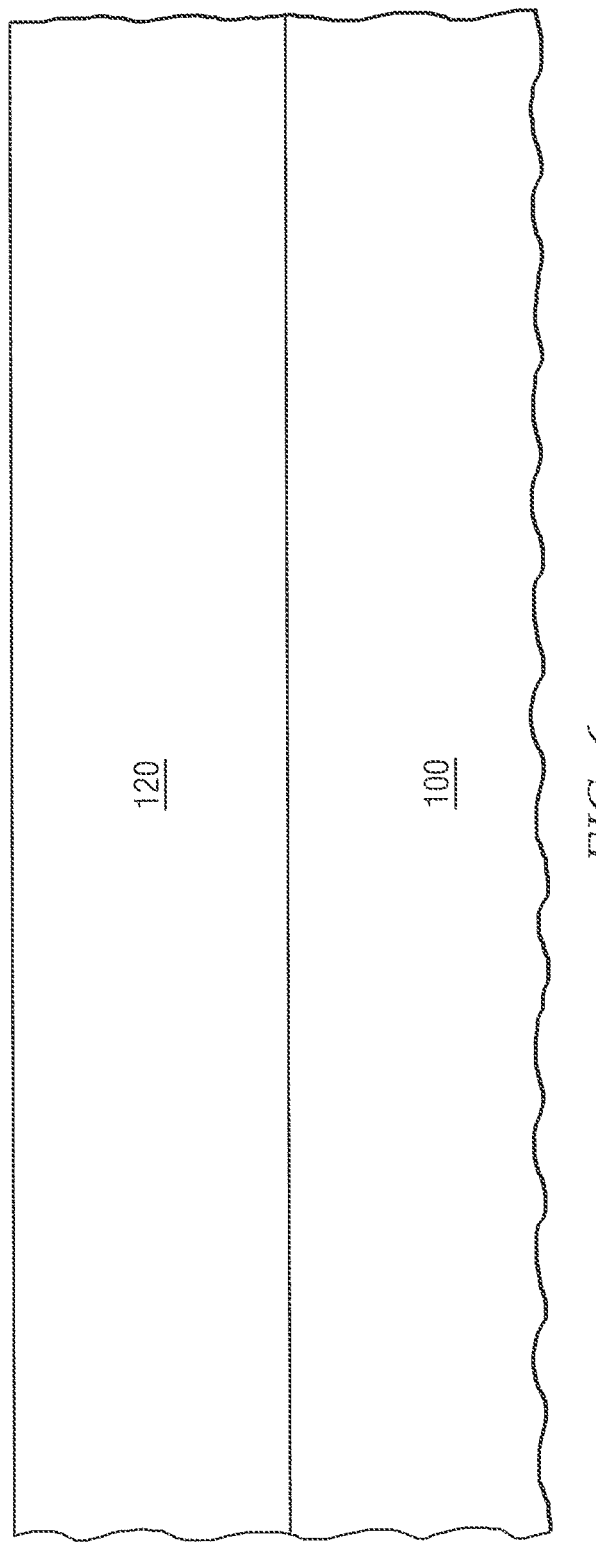

As illustrated in FIG. 6a, a first well region 120 is formed over the substrate 100. The first well region 120 is formed using an epitaxial process in one embodiment. In various embodiments, the first well region 120 is doped to a concentration of about $5 \times 10^{16}$ cm$^{-3}$ to about $5 \times 10^{18}$ cm$^{-3}$, and about $5 \times 10^{17}$ cm$^{-3}$ in one embodiment. The first well region 120 is doped during the epitaxy in one embodiment. Alternatively, the first well region 120 is doped using an implant or a diffusion process.

The trench openings 111 may be formed using a lithography process. For example, a hard mask (not shown) is deposited over the substrate 100 and patterned using a lithography process. Using the patterned hard mask as a etch mask, the trench openings 111 are formed by etching the first well region 120 and the substrate 100. Thus, the trench openings 111 separate the first well region 120 into first, second, third, and fourth regions 151, 152, 153, and 154. Any remaining hard mask is removed.

Figure 6C:
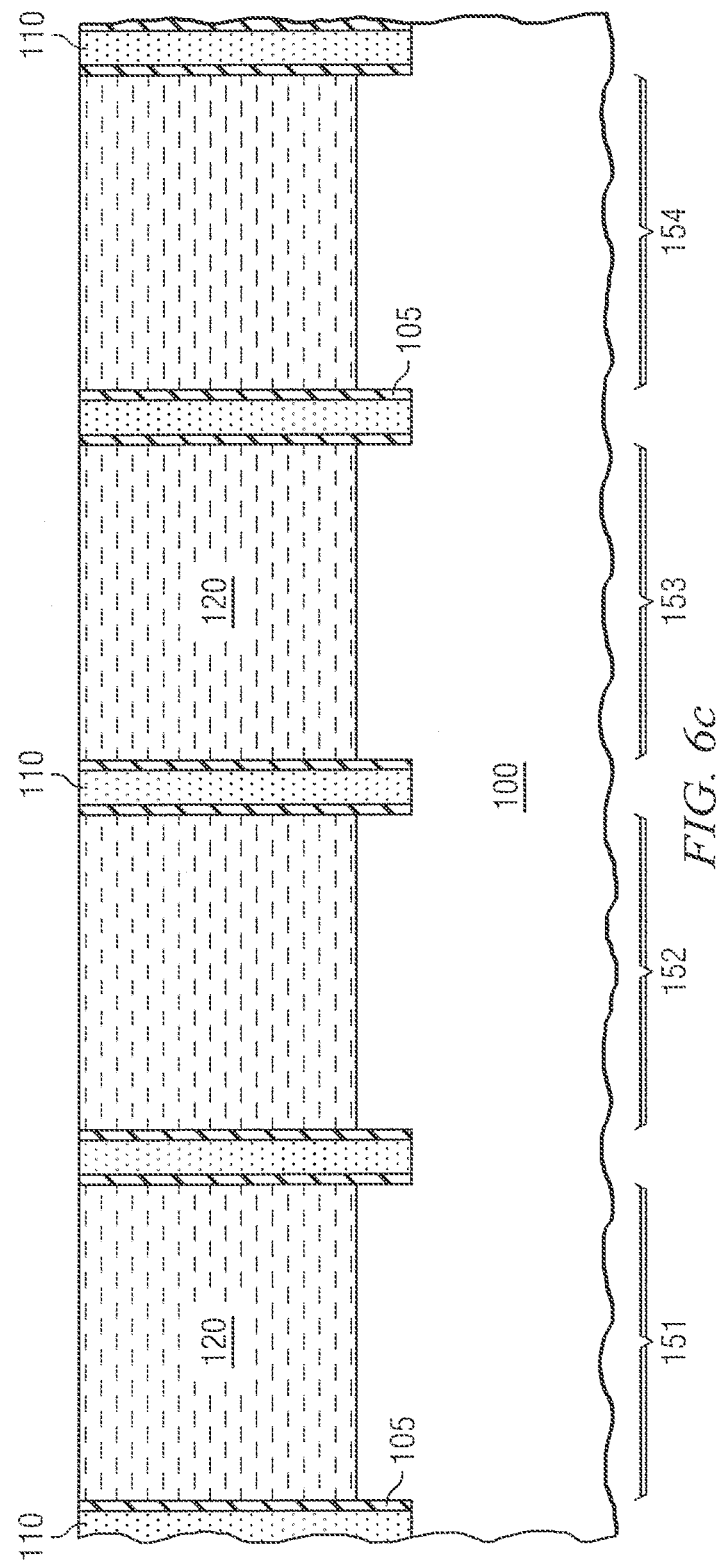

An insulating liner 105 is deposited and removed anisotropically leaving spacers on the sidewalls of the trench openings 111, resulting in the structure shown in FIG. 6b. The trench openings 111 are filled with a conductive material forming the trenches 110 as illustrated in FIG. 6c. In various embodiments, the trench openings 111 are filled with polysilicon doped with a same conductivity type as the substrate 100.

A second well region 130 is formed within the first well region 120. The second well region 130 is formed by implanting into a portion of the first well region 120. For example, a first portion of the first well region 120 is masked and the exposed portion is implanted into. The second well region 130 is doped to be opposite in doping to the first well region 120.

Figure 6D:
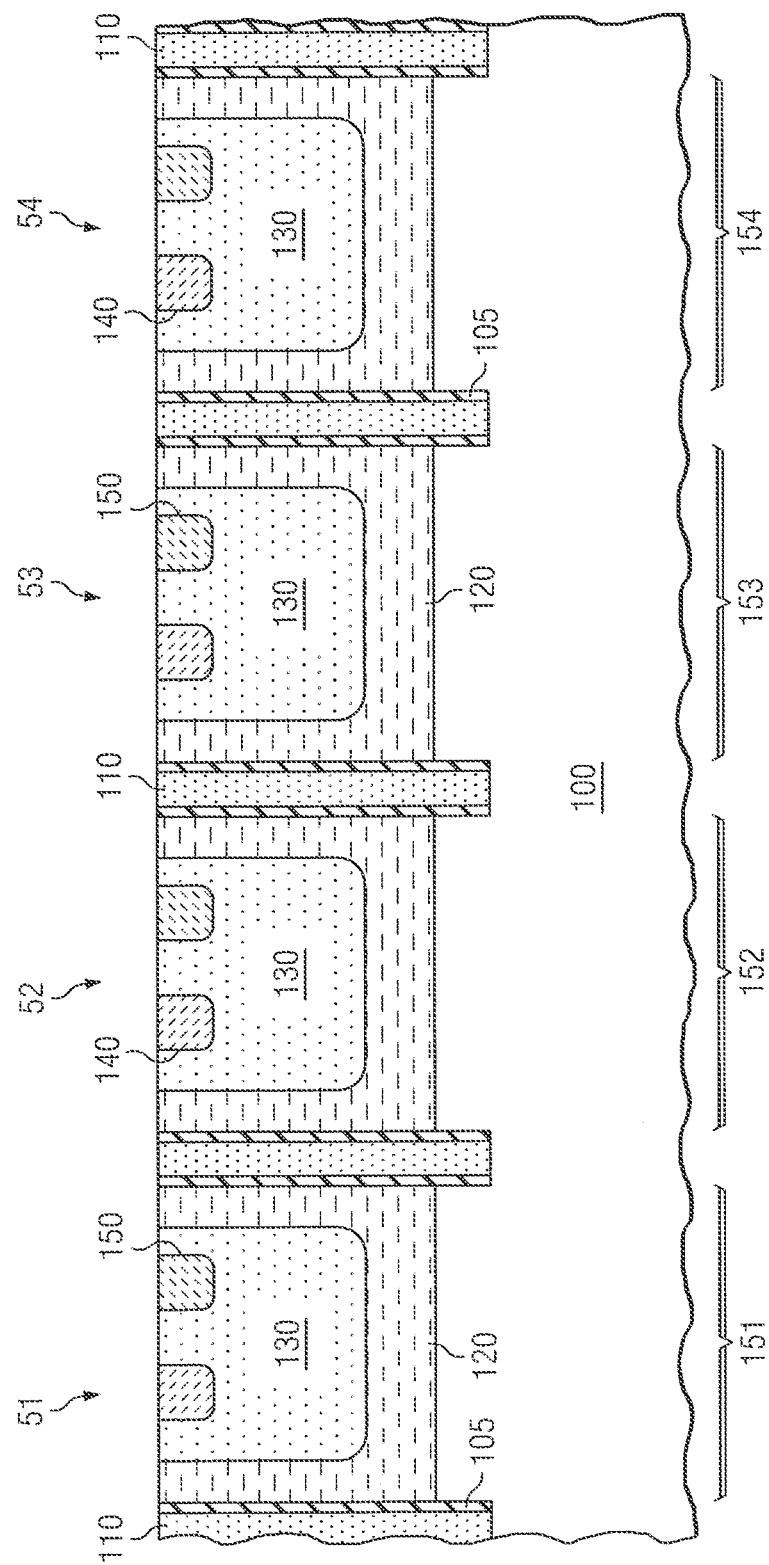
Figure 6E:
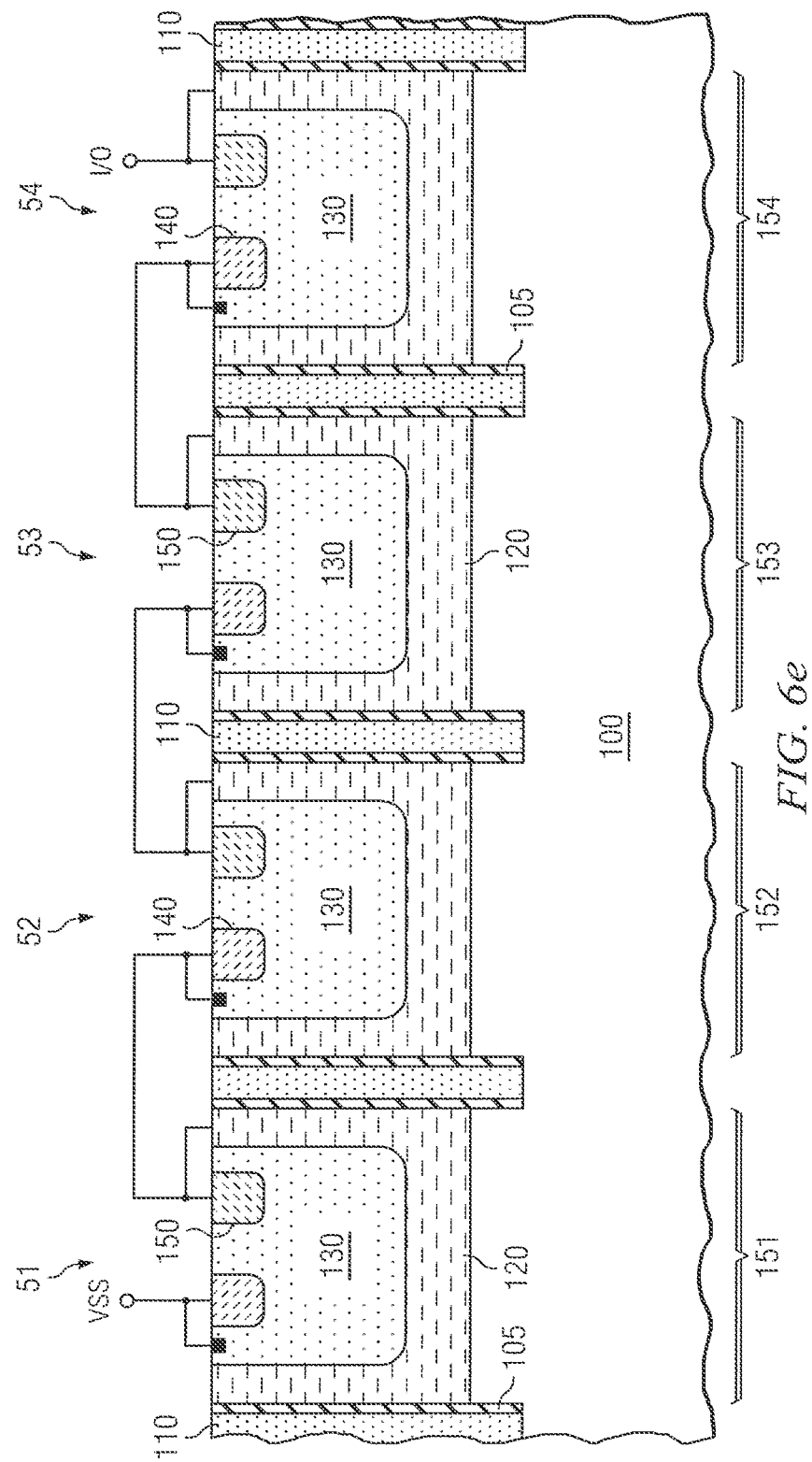

A first doped region 140 and a second doped region 150 are subsequently formed by implantation and annealing forming the transistors 51-54 (FIG. 6d). The transistors 51-54 are coupled together using the metallization layers, which are formed over the substrate 100 (FIG. 6e).

In various embodiments, a semiconductor device comprises a first ESD device having a p/n junction disposed in a first region. A second ESD device having a p/n junction is disposed in a second region. The second region is adjacent the first region but is separated (electrically isolated) from the first region by a first trench. A third ESD device having a p/n junction is disposed in a third region. Similarly, the third region is disposed adjacent the second region but separated thereby electrically isolated from the second region by a second trench. A fourth ESD device having a p/n junction is disposed in a fourth region. The fourth region is adjacent the third region but electrically isolated from the third region by a third trench. The first, second, third, and fourth ESD devices are diodes, bipolar transistors, field effect transistors, or thyristors in various embodiments.

Advantageously, embodiments of the invention reduce fabrication costs as high voltage ESD devices use a process common to the low voltage ESD devices. The cost savings is realized by the reduction in mask steps and reduction in number of implant steps, etc.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming an electrostatic discharge (ESD) device region within a semiconductor body;
   forming a first ESD device in a first region of the ESD device region; and
   forming a second ESD device in a second region of the ESD device region;
   forming a first trench in the semiconductor body, the second region being separated from the first region by the first trench;
   lining sidewalls of the first trench with an insulator liner; and
   filling the first trench at least partially with a conductive material.

2. The method of claim 1, further comprising coupling a cathode region of the first ESD device to an anode region of the second ESD device.

3. The method of claim 1, wherein the first and the second ESD devices comprise bipolar transistors.

4. The method of claim 3, wherein the bipolar transistors comprise npn transistors.

5. The method of claim 3, wherein a collector region of the first ESD device is coupled to an emitter region of the second ESD device.

6. The method of claim 3, wherein an emitter region and a base region of the first ESD device are coupled together.

7. The method of claim 1, wherein the conductive material comprises a polysilicon material having a same conductivity type as the semiconductor body.

8. The method of claim 1, wherein the conductive material comprises a semiconductor material having a same conductivity type as the semiconductor body.

9. The method of claim 1, wherein the conductive material comprises a wide band-gap semiconductor material having a same conductivity type as the semiconductor body.

10. The method of claim 1, wherein the semiconductor body comprises a bulk silicon substrate.

11. The method of claim 1, further comprising:
    forming a third ESD device in a third region of the ESD device region; and
    forming a second trench in the semiconductor body, the third region being separated from the second region by the second trench.

12. The method of claim 1, wherein the first trench is at least 5 μm deep.

13. The method of claim 1, wherein the first ESD device is coupled to a reference voltage node, and wherein the second ESD device is coupled to a node to be protected.

14. The method of claim 1, wherein an operating voltage of the first ESD device and an operating voltage of the second ESD device is less than about 5V, and wherein an operating voltage of the semiconductor device is greater than about 10V.

15. The method of claim 1, wherein forming the first ESD device and forming the second ESD device comprises:
    forming a first well region of a first conductivity type over and/or within the semiconductor body;
    forming a second well region of a second conductivity type within the first well region, the second conductivity type being opposite to the first conductivity type; and
    forming a first and a second doped region of the first conductivity type within the second well region, the first and the second doped regions being separated by a portion of the second well region, wherein the first well region of the first ESD device is separated from the first well region of the second ESD device by the first trench.

16. The method of claim 1, wherein the first and the second ESD devices comprise diodes, and wherein the first and the second ESD devices are a same type of device.

17. The method of claim 1, wherein the first and the second ESD devices comprise thyristors, and wherein the first and the second ESD devices are a same type of device.

18. The method of claim 1, wherein the first and the second ESD devices comprise field effect transistors, and wherein the first and the second ESD devices are a same type of device.

19. A method of fabricating a semiconductor device, the method comprising:

forming an electrostatic discharge (ESD) device region within a semiconductor body;

forming a first ESD device in a first region of the ESD device region; and forming a second ESD device in a second region of the ESD device region, the second region being separated from the first region by a first trench; and forming a wide band gap semiconductor material having the same conductivity type as the semiconductor body within the first trench, the first trench contacting the semiconductor body along sidewalls of the first trench.

20. The method of claim 19, wherein the first and the second ESD devices comprise bipolar transistors.

21. The method of claim 20, wherein the bipolar transistors comprise npn transistors.

22. The method of claim 20, further comprising coupling a collector region of the first ESD device to an emitter region of the second ESD device.

23. The method of claim 20, further comprising coupling an emitter region and a base region of the first ESD device.

24. The method of claim 19, wherein forming the first ESD device and forming the second ESD device comprises:

forming a first well region of a first conductivity type over and/or within the semiconductor body;

forming a second well region of a second conductivity type within the first well region, the second conductivity type being opposite to the first conductivity type; and forming a first and a second doped region of the first conductivity type within the second well region, the first and the second doped regions being separated by a portion of the second well region, wherein the first well region of the first ESD device is separated from the first well region of the second ESD device by the first trench.

25. The method of claim 19, further comprising:

forming a third ESD device in a third region of the ESD device region; and forming a second trench in the semiconductor body, the third region being separated from the second region by the second trench.

26. A method of forming a semiconductor device, the method comprising:

forming a first bipolar transistor having an emitter, a collector and a base region in a first region of an electrostatic discharge (ESD) device region of a semiconductor substrate;

forming a second bipolar transistor having an emitter, a collector and a base region in a second region of the ESD device region; and forming a first trench between the first and the second regions, the first trench isolating the first bipolar transistor from the second bipolar transistor, wherein forming the first trench comprises:

etching a trench opening between the first and the second regions, and at least partially filling the trench opening with a conductive semiconductor material.

27. The method of claim 26, further comprising forming metallization layers over the semiconductor substrate, wherein the metallization layers electrically couple the emitter of the second bipolar transistor with the collector of the first bipolar transistor.

28. The method of claim 26, further comprising coupling the first bipolar transistor to a reference voltage node; and coupling the second bipolar transistor to a node to be protected.

29. The method of claim 26, wherein forming the first bipolar transistor and forming the second bipolar transistor comprises:

forming an epitaxial region of a first conductivity type on the substrate, wherein the first trench extends through the epitaxial region, wherein the epitaxial region of the first bipolar transistor is separated from the epitaxial region of the second bipolar transistor by the first trench.

30. The method of claim 29, wherein forming the first bipolar transistor and forming the second bipolar transistor further comprises:

forming base regions of a second conductivity type within the epitaxial regions, the second conductivity type being opposite to the first conductivity type; and forming the emitters and the collectors of the first conductivity type within the base regions, the emitters and the collectors being separated by a portion of the base regions.

31. The method of claim 29, wherein forming the first trench further comprises:

etching the trench opening through the epitaxial layer; and lining sidewalls of the trench opening with a insulating material.

32. The method of claim 26, further comprising:

forming a third bipolar transistor having an emitter, a collector and a base region in a third region of the ESD device region; and forming a second trench between the second and the third regions, the second trench isolating the second bipolar transistor from the third bipolar transistor.

33. The method of claim 32, further comprising:

forming a fourth bipolar transistor having an emitter, a collector and a base region in a fourth region of the ESD device region; and forming a third trench between the third and the fourth regions, the third trench isolating the third bipolar transistor from the fourth bipolar transistor.

34. The method of claim 26, wherein an operating voltage of the first bipolar transistor and an operating voltage of the second bipolar transistor is less than about 5V, and wherein an operating voltage of the semiconductor device is greater than about 10V.

* * * * *